(12) United States Patent
Bielmeier et al.

(10) Patent No.: US 7,342,398 B2
(45) Date of Patent: Mar. 11, 2008

(54) METHOD, DEVICE AND MAGNETIC RESONANCE TOMOGRAPHY SYSTEM FOR MONITORING EMITTED RF ENERGY

(75) Inventors: Wolfgang Bielmeier, Nürnberg (DE); Klaus Ludwig, Nürnberg (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 11/197,008

(22) Filed: Aug. 4, 2005

(65) Prior Publication Data
US 2007/0024283 A1    Feb. 1, 2007

(30) Foreign Application Priority Data
Aug. 4, 2004   (DE) ............ 10 2004 037 840

(51) Int. Cl.
*G01V 3/00*       (2006.01)
(52) U.S. Cl. ............................................. 324/314
(58) Field of Classification Search ........ 324/300–322; 600/410–435
See application file for complete search history.

(56) References Cited

U.S. PATENT DOCUMENTS

| | | | |
|---|---|---|---|
| 5,343,149 A * | 8/1994 | Hanawa | 324/314 |
| 6,426,623 B1 * | 7/2002 | Bernstein | 324/314 |
| 6,759,847 B2 * | 7/2004 | Brinker et al. | 324/309 |
| 6,762,605 B2 | 7/2004 | Brinker et al. | |
| 6,812,698 B1 * | 11/2004 | Tsukamoto | 324/309 |
| 6,841,999 B2 * | 1/2005 | Arneth et al. | 324/309 |
| 7,030,615 B2 * | 4/2006 | Gortler | 324/318 |
| 7,078,901 B2 * | 7/2006 | Feiweier et al. | 324/318 |
| 2002/0093336 A1 | 7/2002 | Bernstein | |

FOREIGN PATENT DOCUMENTS

JP              838447       * 8/1996

* cited by examiner

Primary Examiner—Brij Shrivastav
Assistant Examiner—Dixomara Vargas
(74) Attorney, Agent, or Firm—Schiff Hardin LLP

(57) ABSTRACT

In a method, device and magnetic resonance tomography system for monitoring a radio-frequency apparatus in which radio-frequency pulses are emitted at temporal intervals and in which measurement values representing the power of the radio-frequency pulses are measured at temporal intervals, the measurement values are used to determine exposure values that represent a physiological effect that the radio-frequency pulses have on a subject exposed to the radio-frequency pulses. Based on a number of exposure values, exposure-monitoring values are respectively formed and the radio-frequency apparatus is limited in function if an exposure-monitoring value reaches or exceeds an exposure limit value.

11 Claims, 3 Drawing Sheets

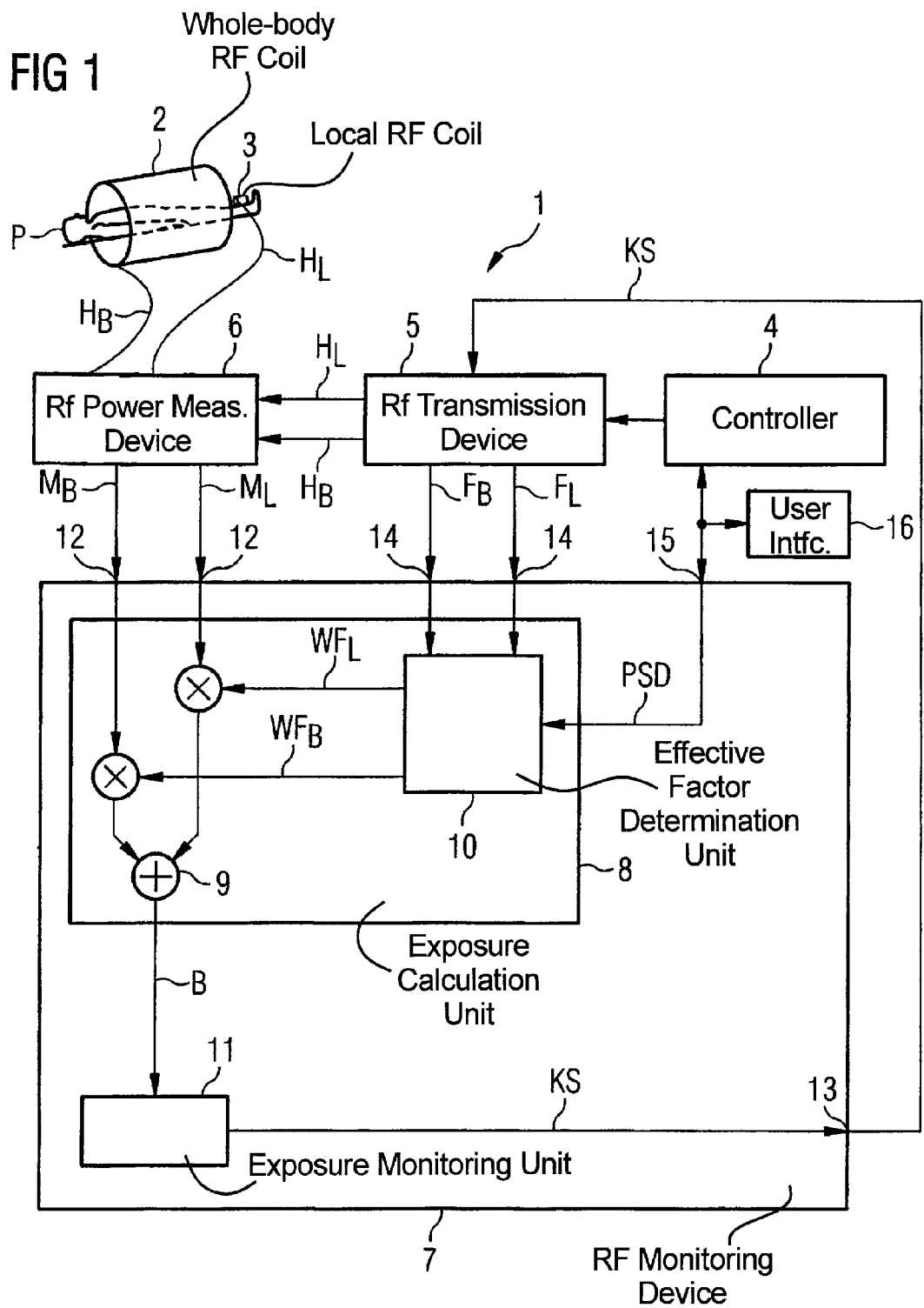

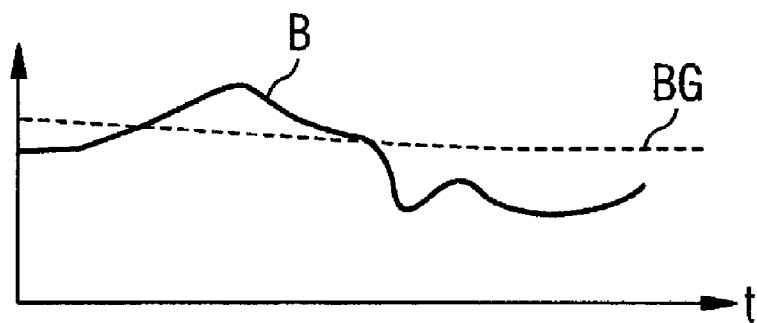
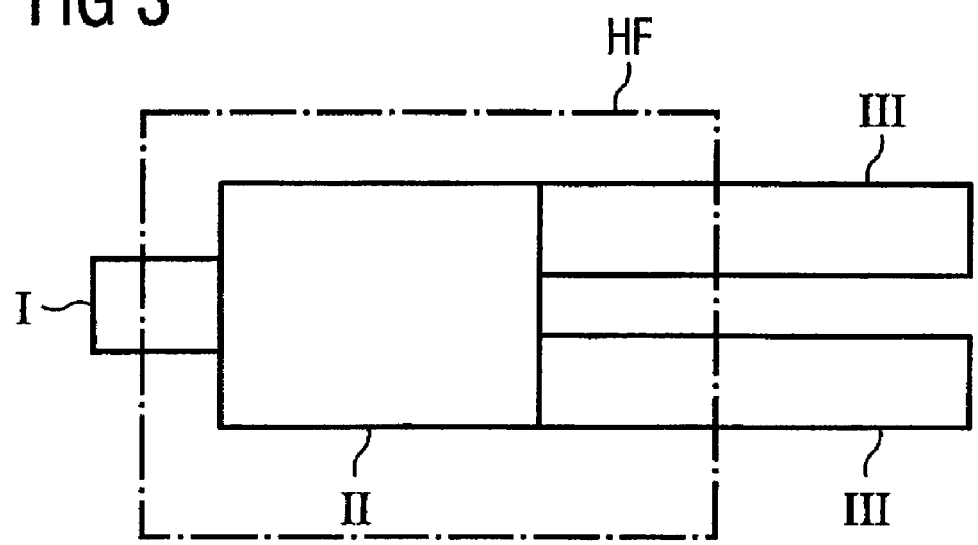

METHOD, DEVICE AND MAGNETIC RESONANCE TOMOGRAPHY SYSTEM FOR MONITORING EMITTED RF ENERGY

BACKGROUND OF THE INVENTION

1. Field of the Invention

The present invention concerns a method for monitoring RF energy emission by a radio frequency apparatus as well as a corresponding radio frequency apparatus and a corresponding radio frequency monitoring apparatus for implementation of such a method. Moreover, the invention concerns a magnetic resonance tomography system with such a radio frequency apparatus.

2. Description of the Prior Art

Magnetic resonance imaging, based on examination of the nuclear magnetic resonance of protons of a body region, has become established as an imaging modality in the medical field. In this modality, a strong, stable, homogenous magnetic field is initially generated around the body region, causing a stable alignment of the protons in the appertaining body region. This stable alignment is then altered by radio frequency energy emitted in to the body region. This energetic simulation is ended and the magnetic resonance signals generated in the body are measured by suitable reception coils in order to make conclusions about the tissue in this body region.

A magnetic resonance tomography system includes a number of interacting components, each one of which requires the use of modern and complex technologies. A central element of a magnetic resonance tomography system is the radio frequency apparatus. This is responsible for the generation of the radio frequency pulses to be radiated into a body region. The radio frequency pulses output by a radio frequency power amplification device of the radio frequency apparatus of a magnetic resonance tomography system are supplied via a measurement device to a transmission coil that radiates the radio frequency pulses into a body region. "Transmission coil", as used herein means an arbitrary antenna device with which the radio frequency pulses can be radiated.

With the development and establishment of magnetic resonance tomography systems, limit values that regulate the maximum radio frequency irradiation in the human body have been normalized to ensure the patient safety. A typical limit value for this is the maximal allowable SAR value (SAR=specific absorption rate).

To obtain these limit values, via the aforementioned measurement device measurement values are acquired that represent the power of the radio frequency pulses radiated by the transmission coil. Power-monitoring values are formed on the basis of a number of power measurement values. These power-monitoring values are then compared with fixed power limit value provided by a norm, this fixed power limit value being selected so that the predetermined SAR limit value is not exceeded. The radio frequency apparatus is automatically limited in terms of its function when a monitoring value exceeds the predetermined threshold.

Such a method is described, for example, in US 2002/0093336 A1. In order to increase safety, it is proposed to measure the radio frequency power and to form a number of sliding radio frequency power average values over respective different time intervals. Each of the time intervals is associated with its own switch threshold. When one of the sliding average values exceeds the associated switch threshold, the magnetic resonance measurement is aborted or modified.

A similar method is described in DE 101 53 320 A1. In order to prevent unwanted forced shutdowns or changes during the measurement due to overruns of the power limit values, predictions about the probable SAR values reached in a measurement are additionally made before the measurement. Expected limit value overruns are already known in advance due to these predictions, so that if necessary the measurement protocol can be changed in order to safely adhere to the limit values. In order to prevent with safety an overrun of the SAR limit value (set by statute) in the measurement, however, the actual radio frequency energy radiated by the system during a magnetic resonance measurement is also measured in order, if necessary, to shut down the radio frequency system given an overrun of the allowed, accumulated radio frequency energy within a predetermined time interval.

This means that the maximum allowable SAR was conventionally always converted into a maximum allowable power and this power limit value was monitored during a magnetic resonance measurement. The physiological effect of radio frequency energy on a human or animal body, however, depends on, among other things, the frequency and the coil type, i.e. on whether the coil emits in a circular or linearly-polarized manner or whether it is a volume or surface coil. Moreover, the effect also depends on the position of the coil on the body of the patient. In the conventional monitoring methods, examinations had to be done in part with immense safety margins with regard to the actual critical value in order to ensure 100% safety for the patient. This means that the allowable power limit value generally lies significantly lower than this is actually necessary to obtain the maximum exposure.

Since a lower image quality normally is associated with lower radio frequency power, it would be desirable to reduce the overly large safety margins. It must also be considered that a lower image quality ultimately leads to exposures that may not offer the desired diagnosis possibilities, or even to exposures having to be produced again, which in turn leads to a higher exposure of the patient. This problem occurs to a particular degree in what is known as multinuclear spectroscopy. Such multinuclear spectroscopy measurements are used to an increasing degree in magnetic resonance diagnostics. Instead of only one nucleus type being excited in the measurement; decouplings of other nuclei also occur in order to generate additional parameter images that can significantly improve the later evaluation of the measurement results. For this purpose, radio frequency energies must be radiated at various frequencies and in part also with various coils, i.e. on different transmission paths. Although, given the same irradiation power, the physiological effect and thus the radiated SAR is different over the various transmission paths, a correspondingly different parameterization has conventionally not been possible in the monitoring of the radio frequency pulses. This means that it has conventionally been assumed that all radio frequency pulses with the same energy or power cause the same exposure in the body. A conversion of the pulses or series of the pulse sequences planned by the measurement program into, for example, a SAR value and the consequential control of the radio frequency transmission device is not possible since the monitoring with regard to the SAR value must be autonomous in and may not rely on specifications from predictions of the measurement program that provides the pulse sequences for the measurement. The effect most harmful for the patient conventionally has been assumed for each measured radio frequency pulse in a "worst case" scenario. A simultaneous monitoring of the transmission power on various paths in one and the same measurement was previously not possible. A very early technical limit was therefore set for the applications and experiments—in particular with regard to multinuclear spectroscopy.

SUMMARY OF THE INVENTION

An object of the present invention is to provide a method, device and magnetic resonance imaging apparatus for monitoring a radio frequency apparatus to safely prevent the radiated radio frequency power from exceeding a limit value that is dangerous for the patient, while allowing an optimally good approach to this safe limit value so that data acquisition can take place with optimally high transmission power below the limit value.

The invention proceeds from the recognition that in methods for monitoring a radio frequency apparatus in magnetic resonance imaging, excessive safety margins are frequently, unnecessarily adhered to due to the measurement techniques that are used. As explained above, this occurs in the typical method of converting the SAR limit value into a power limit value and then monitoring adherence to the given power limit value.

Based on this insight, using measurement values obtained at temporal intervals (the measurement values representing the power of the radio frequency pulses) the above object is achieved by initially determining exposure values that represent the physiological effect that the radio frequency pulses have on a subject exposed to the radio frequency pulses. Exposure-monitoring values are then respectively formulated based on a number of the exposure values. The radio frequency apparatus is limited in function when an exposure-monitoring value reaches or exceeds an exposure limit value.

In the inventive method, a limitation of the functioning of the radio frequency apparatus can be, for example, a shutdown of the RF transmission device or the radio frequency power amplification device, or a temporary deactivation of one or both devices, or a reduction of the transmission power.

For example, in the inventive method the SAR limit value can be used directly as an exposure limit value by calculating the exposure values, determined on the basis of the individual measurement values representing the power of the radio frequency pulses, in the form of current SAR exposure values. The exposure-monitoring values then can be formed using these current SAR exposure values in a manner similar to the manner this was previously implemented with the power-monitoring values, for example by averaging the exposure values and/or integrating the exposure values over specifically-set predetermined time spans in order to form the exposure-monitoring value. A preferred embodiment for the formation of exposure-monitoring values is described in more detail below.

The inventive method in particular has the advantage that separate measurement values, that respectively represent the radio frequency pulses emitted via the appertaining transmission path, can be measured for each of the transmission paths in a radio frequency apparatus that emits radio frequency pulses via a number of transmission paths. Using the measurement values, separate exposure values then can be determined for each of the measurement paths. These separate exposure values represent the physiological effect that the radio frequency pulses emitted via the appertaining transmission path actually have on the subject exposed to the radio frequency pulses. The generation of the exposure-monitoring values must then be based on a suitable combination of the separate exposure values, for example a simple addition or weighted addition of the exposure values determined for the individual transmission paths. For example, in this method it is possible to evaluate the transmission paths differently (namely corresponding to the actual SAR exposure for that path or channel caused by the transmission power thereof) for each of the transmission paths (which RF energy is emitted respectively with different frequencies and/or via coils of different types, positions and geometries) in multinuclear spectroscopy scans (examination).

In the practical application of the invention, the radio frequency exposure should be monitored for the specific subject exposed to the radio frequency power. For example, in a magnetic resonance tomography system the radio frequency exposure should be monitored for the patient currently in the scanning unit. Measurement values therefore must be used that represent as well as possible the power capacity remaining in the transmission coil or the power radiated by the transmission coil. The measurement values therefore preferably are based on the difference between the forward power emitted by a transmission device of the radio frequency apparatus to the transmission coil and the return power returning from the transmission coil.

Since measurement values that directly represent the power of the radio frequency pulses emitted by the transmission device also indirectly represent the power remaining in the transmission coil, in principle (in a simpler exemplary embodiment) only the power emitted by the transmission device or a corresponding measurement value could be used.

The measured measurement values preferably are used in a pre-processed form (i.e. for example after an analog-digital conversion and/or a conversion of effective voltages into the difference of forward power and return power) for the further determination of the exposure values. The temporal intervals between the radio frequency pulses and between the measurements can be the same or different.

The determination of the exposure values on the basis of the measurement values is relatively uncomplicated if undertaken as a multiplication of the appertaining measurement values with an effective factor. Effective factors (separately determined for each of the transmission paths) for multiplication with the measurement values measured on the appertaining transmission path are used given emission of the radio frequency pulses via a number of transmission paths.

In particular the frequency of the emitted radio frequency pulses can be involved in the calculation of the effective factors. The dependency on the frequency is quadratic, i.e. the frequency is a very important factor. Furthermore, in the calculation of the effective factor the position and/or the geometry of the transmission coil via which the appertaining radio frequency pulses are emitted also preferably is taken into account.

An exact determination of the exposure value (for example the current SAR value) from the current transmission power normally is possible based on these parameters.

The effective factors can already be determined before a measurement. For example, which exposure factor is to be used at which frequency, in which coil geometry and coil position, and in which patient type can be stored in a storage unit (memory). The patient type represents specific parameters of the patient such as build, size, weight etc. For example, a suitable SAR factor can simply be determined by the SAR exposure generated at a specific power, with a specific patient or patient type, a specific position and geometric design of the coil and a specific frequency being calculated and divided by the power.

The correct SAR factor then can be very quickly selected from a databank (library) continuing such SAR factors (since normally not only is the power measured, but the frequency of the emitted radio frequency pulses as well as the position and geometry of the coil and the patient type are ascertained), and with this the measured power can be directly converted into a current SAR exposure value to which the patient is exposed.

In principle, the effective factor can also be determined dependent on other parameters. For example, the maximum radio frequency power that a patient tolerates (without suffering health effects) is, among other things, dependent on various environment parameters. Often a direct connection exists between the maximum radio frequency power and climate values, for example the temperature and/or the humidity of the direct environment of the patient, because different current SAR exposure values are reached given the same radio frequency power. Such environment parameters can additionally or alternatively be accounted for in the establishment of the exposure limit values.

Given use of a number of transmission paths, the exposure values of the individual transmission paths can simply be added. A different linking (combination) of the partial exposure values, such as (for example) a weighted addition, is also possible in order to obtain the overall exposure values.

In the determination of the exposure-monitoring values from the exposure values, a time window is respectively, preferably considered that slides (shifts) in the overall time range over the measurement values, or over exposure values determined therefrom. The exposure-monitoring values used for the comparison with an exposure limit value (the exposure-monitoring values being respectively based on a number of measurement values or exposure values in the respective time window under consideration) very promptly reproduce the actual radiation exposure (for example in a magnetic resonance tomography system) that has actually occurred for a patient in the past time span.

In an embodiment, monitoring of the exposure values (and thus the radio frequency power) ensues via various nested time windows, (for example) a short-term monitoring and a long-term monitoring are implemented. Respective exposure-monitoring values are simultaneously determined for a number of time windows of different lengths (preferably for two time windows of 10 s and 360 s) and compared with exposure limit values applicable for the respective time spans. The radio frequency apparatus is then limited in terms of function if only one of the exposure-monitoring values reaches or exceeds the associated exposure limit value. This method serves for monitoring the irradiation of a specific higher dose over a longer time window and simultaneously ensures that the entire power that is permissible within the long time window to be monitored is not radiated onto the patient within a short time window, which would be dangerous for the patient exists due to the short-term exposure elevation.

In order to be able to operate independently of each time period, the exposure-monitoring value can be generated from the sum of a number of exposure values that are respectively weighted with an interval length between the measurement of two successive measurement values. This means that, for example, an exposure value is multiplied with the interval length between the preceding measurement and the appertaining measurement. In this manner, the exposure values are integrated into the time window under consideration according to the surface measure and an exposure average is calculated from this.

The invention also encompasses a radio frequency apparatus with a transmission device for emission of radio frequency pulses, a measurement device for measurement of measurement values that represent the power of the emitted radio frequency pulses, and a radio frequency monitoring device that is coupled with the measurement device. The radio frequency monitoring device, which can be executed as a processor, is operated (preferably in terms of programming) so that measurement values are measured at temporal intervals and exposure values are determined using the measurement values, the exposure values representing the physiological effect that the radio frequency pulses have on a subject exposed to the radio frequency pulses. Furthermore, the radio frequency monitoring device is designed so that exposure-monitoring values are formed based on a number of exposure values and the radio frequency apparatus is then limited in terms of function if the exposure-monitoring value reaches or exceeds an exposure limit value.

The invention also encompasses a radio frequency monitoring device having a measurement value input for measurement values and a monitoring signal output for monitoring signals. The radio frequency monitoring device is designed so that measurement values are measured at temporal intervals and, using the measurement values, corresponding exposure values are determined that represent the physiological effect that the radio frequency pulses have on a subject exposed to the radio frequency pulses. Furthermore, the radio frequency monitoring device generates exposure-monitoring values based on the simulation of a number of exposure values and a monitoring signal that limits the functioning of the radio frequency apparatus is output at the monitoring signal output if an exposure-monitoring value reaches or exceeds an exposure limit value.

The invention also encompasses a magnetic resonance tomography system having a radio frequency apparatus as described above. In addition, the magnetic resonance tomography system has all further typical components such as, for example, a magnet system for generation of a basic magnetic field in an examination volume, a gradient system with a number of gradient coils for application of magnetic field gradients, a radio frequency reception system (for example as a part of the radio frequency apparatus) with reception coils, suitable reception amplifiers and an image computer. For example, the transmission coils can also serve as reception coils.

DESCRIPTION OF THE DRAWINGS

FIG. 1 is a block diagram of a radio frequency apparatus for a magnetic resonance tomography system in accordance with the invention.

FIG. 2 is a diagram illustrating an example of the relationship of the current overall exposure and the exposure limit value in accordance with the invention.

FIG. 3 illustrates a cylinder model for use in a calculation of the aspect factors for the determination of the SAR exposure, dependent on the radiated transmission power in accordance with the invention.

DESCRIPTION OF THE PREFERRED EMBODIMENTS

Figure 4:
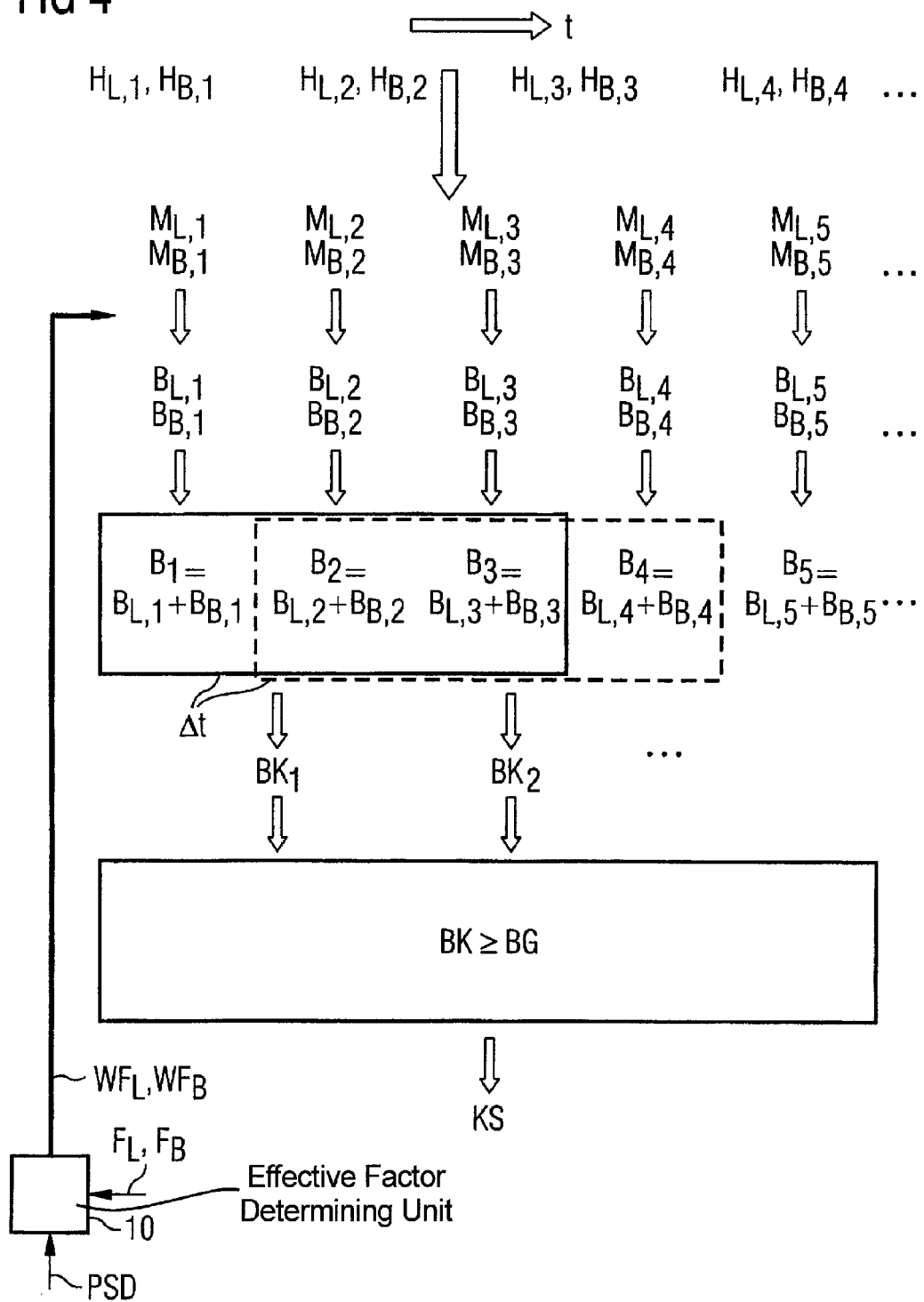
FIG. 4 is a simplified flow diagram of a method for monitoring of a radio frequency apparatus in accordance with the invention.

As a basic component of a magnetic resonance tomography system, FIG. 1 shows a radio frequency apparatus 1, the representation selected here concentrating on the transmission branch of the radio frequency apparatus.

In addition to the transmission branch of the radio frequency apparatus 1, the magnetic resonance tomography system has a magnetic resonance scanner including a magnet system (not shown) for generation of a measurement field that at least partially surrounds a patient P during an examination as well as gradient coils (likewise not shown) for application of magnetic field gradients. Moreover, a radio frequency reception system (not shown) is provided with at least one reception coil and a suitable reception amplifier. The radio frequency apparatus has transmission coils 2, 3, which can also form the aforementioned reception coils. An image computer (not shown) that reconstructs images from the acquired signals in a known manner, for display on a screen, and/or for storage in a memory (archive). A controller 4 coordinates the interaction of the individual components.

The radio frequency apparatus 1 includes a transmission device 5 with a radio frequency power amplifier device (not shown) that emits radio frequency pulses $H_L$, $H_B$ in a power range between 10 Watt and 20 kW. This transmission device 5 is activated by the controller 4. The operation can be monitored by the operator in a typical manner via a user interface 16 with a monitor, keyboard, mouse, etc. Among other things, the process of the individual measurements is monitored in the controller 4 on the basis of predetermined measurement protocols and, in addition to the emission of the radio frequency pulses $H_L$, $H_B$ by the transmission device 5, the switching of the magnetic field gradients (not shown) is controlled in a manner adapted to the slice image to be obtained so that the desired data are acquired.

The radio frequency pulses $H_L$, $H_B$ are conducted from the transmission device 5 to a power measurement device 6 via a transmission cable. The radio frequency pulses $H_L$, $H_B$ are then forwarded from the measurement device 6 to the respective transmission coils 2, 3. In the present case, the different radio frequency pulses $H_L$, $H_B$ are supplied via different transmission lines for emission from two different coils 2, 3, one being a whole-body coil 2 (body coil) and the other being a local coil 3 situated directly on the patient. The radio frequency pulses $H_L$, $H_B$ are then radiated from the transmission coils 2, 3 into a body region or various body regions of a patient P who is positioned within the body coil 2.

The measurement device 6 is here executed as a sensor, in particular a sensor known as a Transmit Antenna Level sensor (TALES), and has directional couplers to extract a small part of each forward power emitted by the transmission device 5 at the respective transmission coils 2, 3 and each return power returning from the respective transmission coils 2, 3. Each pair of forward and return powers is then converted into an effective voltage. The effective voltages so measured can be between 0 and 1000 volts. The measured values are supplied by the measurement device 6 to a radio frequency monitoring device 7 via measurement value inputs 12, if applicable after analog-digital conversion and other pre-processing. The radio frequency monitoring device 7 has a processing device embodying a digital signal processor. The schematic design of this device 7 can be seen from FIG. 1.

The measured voltage values are converted into the resulting power remaining in the transmission coils 2, 3 of the magnetic resonance tomograph at specific time intervals, for example in intervals of 20 µs, by the return power being subtracted from the incoming power, i.e. the forward power. This means that measurement values $M_L$, $M_B$ for the radio frequency monitoring device 7 are acquired at fixed time intervals of 20 µs. This pre-processing of the voltage values into the actual desired measurement values $M_L$, $M_B$ occurs in the measurement device 6. Alternatively, this can also ensue via an interface at the measurement value input 12, or only in the radio frequency monitoring device 7.

The measurement values $M_L$, $M_B$ (that respectively represent the power of the radio frequency pulses $H_L$, $H_B$ for the local coil 3 and for the body coil 2) are initially transferred to a (SAR) exposure calculation unit 8 within the radio frequency monitoring device 7.

The frequency values $F_L$, $F_B$ (that represent the frequencies of the respective RF pulses $H_L$, $H_B$ emitted via both of the transmission paths) are supplied from the transmission device 5 to the exposure calculation unit 8 via further signal inputs 14 of the radio frequency monitoring device 7.

Moreover, the exposure calculation unit 8 receives patient and coil data PSD via a further signal input 15 of the radio frequency monitoring device 7. The data PSD represent the position and the type of the coils 2, 3 or about the examination subject (the patient P). The data PSD, for example, can be entered via the user interface 16 or can be transferred from the measurement protocol in the controller 4 to the radio frequency monitoring device 7.

The patient and coil data PSD as well as the frequency values $F_L$, $F_B$ are initially supplied to an effective factor determination unit 10 of the exposure calculation unit 8. In this effective factor determination unit 7, the effective factors $WF_L$, $WF_B$ are calculated that currently apply for the respective transmission paths of the local coil 3 and the body coil 2. The measurement values $M_L$, $M_B$ can be converted into the current (partial) exposure values $B_L$, $B_B$ with the aid of such effective factors $WF_L$, $WF_B$.

The system shown in FIG. 1 operates with only two transmission paths, one for the local coil 3 and one for the body coil 2. Moreover, the system can be operated with two frequencies for each transmission path. This means that the associated effective factors $WF_L$, $WF_B$ only have to be determined by the effective factor determination unit 10 for four situations, dependent on the given patient and coil data PSD. In practice, these four effective factors are respectively calculated in advance for various patient types and various positions of the local coil so that the effective factor determination unit 10 only has to select the matching effective factor $WF_L$, $WF_B$ from a databank on the basis of the acquired frequency values $F_L$, $F_B$ and the obtained patient and coil data PSD.

For a pre-calculation of an individual effective factor $WF_L$, $WF_B$, a radiated power can initially be assumed and an SAR value that results due to this radiated radio frequency power at a specific frequency then can be calculated. This can ensue using what are known as the "aspect factors", which specify how much SAR exposure is created from the radiated transmission power for one orientation or which E-field is induced in the body of the patient by a transmission power radiated in a specific manner. Preset norms exist for different orientation such as, for example, a whole-body orientation, a head orientation and an exposed partial body orientation. A cylinder model can be used for calculation of the absorbed power, the patient being modeled as four homogenous cylinders: a head cylinder I, a torso cylinder II and two leg cylinders III, as this is schematically shown in FIG. 3. The individual absorptions of the cylinders in the externally homogeneous radio frequency field then can be calculated using Faraday's law. The irradiation of the patient, i.e. how much of the respective cylinder model is exposed to the radiation, must still be accounted for. This simple model can be refined with simulation calculations. The total absorption then results from the sum of the individual absorptions. The respective SAR exposure ultimately can be calculated from the absorption divided by the corresponding partial body mass. The percentage distribution of the absorbed power for the different orientations thus can be determined. Such calculation methods are known to those skilled in the art. Calculation methods for power absorption are described, for example, by Paul A. Bottomley et al. in "Estimating Radiofrequency Power Deposition in Body NRM-Imaging", Magnetic Resonance in Medicine 2, 1985, p. 336-349. Moreover, there are ready-made simulation programs with which simple models can be checked. Since the SAR exposure also depends on the body mass, this calculation (if it is necessary to be very precise) must be implemented for each individual patient. However, in principle it is sufficient when specific patient types are established that are specified by body size and mass and a corresponding, ready-made value is selected for a patient of the corresponding type. Significant computation effort during the measurement can be saved in this manner.

In this form of the calculation, SAR factors are determined as effective factors $WF_L$, $WF_B$, with which SAR factors a direct conversion of the measurement values $M_L$, $M_B$ representing the radiated transmission power into SAR exposure values $B_L$, $B_B$ is made, by the measurement values $M_L$, $M_B$ being multiplied with the associated SAR effective factors $WF_L$, $WF_B$, as is schematically shown in FIG. 1.

In an overall exposure calculation unit 9, which can be part of the exposure calculation unit 8, the individual partial exposure values $B_L$, $B_B$ are then combined (for example via a simple summation) and thus a current overall exposure value B is determined that corresponds to the current overall SAR.

An exemplary curve of the current overall SAR exposure B is schematically shown over a time axis t in FIG. 2. The exposure limit value BG (here the SAR limit) is also indicated for comparison. This exposure limit value BG can likewise change with time (but normally slowly) because, for example, the (climatic) environment parameters at the tomography apparatus change.

As shown in FIG. 2, the current exposure value B may somewhat exceed the exposure limit value BG for a short time. It must be ensured, however, that this exposure value B does not on average (based on predetermined time intervals of, for example, 10 s and/or 360 s) exceed the exposure value BG (here the SAR limit BG prescribed by the legislator.

For this purpose, as shown in FIG. 1, the current overall exposure value B is supplied to an exposure monitoring unit 11 that keeps the limit values below the predetermined conditions.

FIG. 4 shows a simplified flow diagram of an exemplary embodiment of the inventive method. A number of radio frequency pulses $H_{L,i}$, $H_{B,i}$, i=1, 2, 3, 4, . . . that are emitted by the transmission device 5 are initially shown along a time axis t. Below these are shown measurement values $M_{L,i}$, $M_{B,i}$, i=1, 2, 3, 4, 5, . . . that represent the power of the radio frequency pulses $H_L$, $H_B$, likewise along the time axis t. A number of measurement values $M_L$, $M_B$ are normally acquired for each radio frequency pulse $H_L$, $H_B$. The measurement values $M_{L,i}$, $M_{B,i}$, i=1, 2, 3, 4, 5, . . . are then converted into exposure values $B_{L,i}$, $B_{B,i}$, i=1, 2, 3, 4, 5, . . . using the effective factors $WF_L$, $WF_B$ provided by the effective factor determination unit 10. The exposure values $B_L$, $B_B$ are then summed to form overall exposure values $B_i$, i=1, 2, 3, 4, 5, . . .

A number of the exposure values B is selected using a sliding window Δt that shifts within the time range of the overall exposure values B, and these are further processed to form a monitoring value BK. Here the values $B_1$, $B_2$, $B_3$ are processed to form a first exposure-monitoring value $BK_1$. The measurement values $B_2$, $B_3$, $B_4$ are likewise selected by the sliding window Δt a short time later and further processed to form the exposure-monitoring value $BK_2$. The length of the window Δt is preferably 10 seconds or 360 seconds. A short-term monitoring, for example with a 10-second window, and a long-term monitoring, for example with a 360-second window, particularly preferably are undertaken.

In this example, the monitoring value BK is thereby respectively determined from the selected number of exposure values B, by forming the average value of the selected exposure values B is formed. As a simple example, the selected number of exposure values B is only three values, but this number can be arbitrarily large.

In a further processing stage, the exposure-monitoring values BK are then compared with an exposure limit value BG predetermined by a norm (standard). The exposure limit values can thereby in particular be determined by a norm dependent on the body weight of the appertaining patient. If an exposure-monitoring value BK is larger than or equal to an exposure limit value BG, a monitoring signal KS is output. This monitoring signal KS of the exposure-monitoring unit 11 is then forwarded to the transmission device 5 via a control output 13, so that the transmission device 5 or radio frequency power amplifier contained therein is at least temporarily deactivated.

The method described herein as well as the illustrated radio frequency system or the radio frequency monitoring device are exemplary embodiments that can be modified in various manners by those skilled in the art without deporting from the scope of the invention. In particular the acquisition of the power measurement values can ensue in a different manner than that described above. Moreover, the invention has been described above using the examples of a magnetic resonance tomography system in the medical field, but the invention also can be used in other application fields such as in scientific and/or industrial magnetic resonance tomography systems, or in mobile radio communication systems or in other types of radio-based communication systems.

We claim as our invention:
1. A method for monitoring radio frequency energy emission by a radio frequency apparatus comprising the steps of:
emitting radio frequency pulses from a radio frequency apparatus respectively at temporal intervals, each radio frequency pulse having a radio frequency power and an effective factor associated therewith;
for each of said radio frequency pulses, obtaining a measurement value representing the radio frequency power of the respective radio frequency pulse at temporal intervals, by determining an exposure value for each radio frequency pulse by multiplying the measurement value for that radio frequency pulse by the effective factor for that radio frequency pulse;
for each of said radio frequency pulses, electronically calculating an exposure value from said measurement value, representing a physiological effect of that radio frequency pulse on a subject exposed to that radio frequency pulse;
electronically calculating an exposure-monitoring value based on a plurality of said exposure values; and limiting functioning of said radio frequency apparatus if said exposure-monitoring value equals or exceeds an exposure limit value.

2. A method as claimed in claim 1 wherein the step of emitting said radio frequency pulses comprises emitting said radio frequency pulses respectively via a plurality of different transmission paths, and wherein the step of obtaining said measurement value comprises obtaining respective measurement values for said respective radio frequency pulses in the respective transmission paths, and wherein the step of electronically determining exposure values comprises, for each radio frequency pulse, determining an exposure value for that radio frequency pulse representing an effect of that radio frequency pulse on a subject exposed to that radio frequency pulse in the respective transmission path in which that radio frequency pulse was emitted, and wherein the step of electronically determining said exposure-monitoring value comprises combining the respective exposure values for the respective radio frequency pulses in the respective radio frequency paths.

3. A method as claimed in claim 2 wherein each radio frequency pulse in the transmission path in which that radio frequency pulse was emitted has an effective factor, and wherein the step of electronically determining said exposure values comprises, for each radio frequency pulse, multiplying the effective factor thereof by the measurement value obtained in the transmission path in which that radio frequency pulse was emitted.

4. A method as claimed in claim 3 wherein each radio frequency pulse is emitted at a frequency, and comprising electronically determining the effective factor for each radio frequency pulse dependent on the frequency thereof.

5. A method as claimed in claim 3 comprising emitting said radio frequency pulses respectively from different transmission coils of said radio frequency apparatus, each transmission coil having a position and a geometry associated therewith, and comprising, for each radio frequency pulse, electronically determining the effective factor dependent on at least one of the position and the geometry of the transmission coil from which that radio frequency pulse was emitted.

6. A method as claimed in claim 1 comprising predetermining a time window, and wherein the step of electronically calculating said exposure-monitoring value comprises adding a plurality of said exposure values occurring in the predetermined time window.

7. A method as claimed in claim 6 comprising respectively weighting said exposure values with an interval length between two successive ones of said measurement values.

8. A method as claimed in claim 6 comprising obtaining said measurement values in a time range, and successively shifting said time window in said time range.

9. A radio frequency apparatus comprising:
an RF transmission arrangement comprising a plurality of transmission coils that emit a plurality of radio frequency pulses respectively at temporal intervals via respectively different transmission paths to a subject, each of said radio frequency pulses having a radio frequency power;
a power measurement arrangement that obtains a plurality of measurement values respective representing the power of each of the radio frequency pulses at respective temporal intervals; and
a radio frequency monitoring device supplied with said measurement values, said radio frequency monitoring device comprising a processor that electronically calculates, for each of said radio frequency pulses, an exposure value from said measurement value dependent on the respectively different transmission paths to the subject, said exposure value representing a physiological effect of that radio frequency pulse on the subject exposed to that radio frequency pulse, and that calculates an exposure-monitoring value from said plurality of exposure values, and that limits operation of said transmission arrangement if said exposure-monitoring value equals or exceeds an exposure limit value.

10. A radio frequency monitoring device comprising: a processor having an input to which a plurality of measurement values,
respectively representing measured power of respective radio frequency pulses at temporal intervals, are supplied, said radio frequency pulses having been transmitted via respectively different transmission paths to a subject;
said processor calculating, for each of said radio frequency pulses, an exposure value from said measurement value, dependent on the transmission path for that radio frequency pulse, respectively representing a physiological effect of that radio frequency pulse on the subject exposed to that radio frequency pulse, and said processor calculating an exposure-monitoring value from said plurality of exposure values, and generating a monitoring signal if said exposure-monitoring value equals or exceeds an exposure limit value; and
said processor having an output from which said monitoring signal is emitted.

11. A magnetic resonance tomography system comprising:
a magnetic resonance scanner configured to interact with a patient to obtain magnetic resonance data therefrom, said magnetic resonance scanner comprising a radio frequency device that emits radio frequency energy into the subject;
said radio frequency device comprising an RF transmission arrangement comprising a plurality of transmission coils that emits a plurality of radio frequency pulses via respectively different transmission paths to the subject respectively at temporal intervals, each of said radio frequency pulses having a radio frequency power, a power measurement arrangement that obtains, for each of said plurality, a measurement value representing the power of the radio frequency pulse at respective temporal intervals, and a radio frequency monitoring device supplied with said measurement values, said radio frequency monitoring device comprising a processor that electronically calculates, for each of said radio frequency pulses, an exposure value from said measurement value, dependent on the transmission path for that radio frequency pulse, representing a physiological effect of that radio frequency pulse on the subject exposed to that radio frequency pulse, and that calculates an exposure-monitoring value from said plurality of exposure values, and that limits operation of said transmission arrangement if said exposure-monitoring value equals or exceeds an exposure limit value; and
an image reconstruction computer supplied with said magnetic resonance data that reconstructs an image of a slice of the subject from said magnetic resonance data.

* * * * *